United States Patent [15] 3,654,490
Kan [45] Apr. 4, 1972

[54] GATE CIRCUIT WITH TTL INPUT AND COMPLIMENTARY OUTPUTS

[72] Inventor: David T. Kan, Santa Clara, Calif.
[73] Assignee: Signetics Corporation, Sunnyvale, Calif.

[22] Filed: June 17, 1970
[21] Appl. No.: 47,084

[52] U.S. Cl. ..........307/255, 307/262
[51] Int. Cl. ..........H03k 17/60
[58] Field of Search ..........307/254, 255, 246, 262

[56] References Cited

UNITED STATES PATENTS

| | | | |
|---|---|---|---|
| 3,333,109 | 7/1967 | Updike | 307/255 |
| 3,182,210 | 5/1965 | Jebens | 307/254 |
| 3,244,910 | 4/1966 | Leifer | 307/254 |
| 3,009,070 | 11/1961 | Barnes | 307/254 |
| 3,519,851 | 7/1960 | Groner | 307/246 |
| 3,229,119 | 1/1966 | Bohn et al | 307/299 |

*Primary Examiner*—Donald D. Forrer
*Assistant Examiner*—Harold A. Dixon
*Attorney*—Flehr, Hohbach, Test, Albritton & Herbert

[57] ABSTRACT

A gate circuit having a TTL input characteristic with the input transistor forming in effect two steering diodes driving a phase splitter which has its collector and emitter respectively driving two complementary output transistors. The collectors of the output transistors coupled together form the output terminal of the gate circuit and the emitter of one of the output transistors is coupled to a high voltage supply. This output transistor is also coupled to the phase splitter through an inverting current source.

5 Claims, 1 Drawing Figure

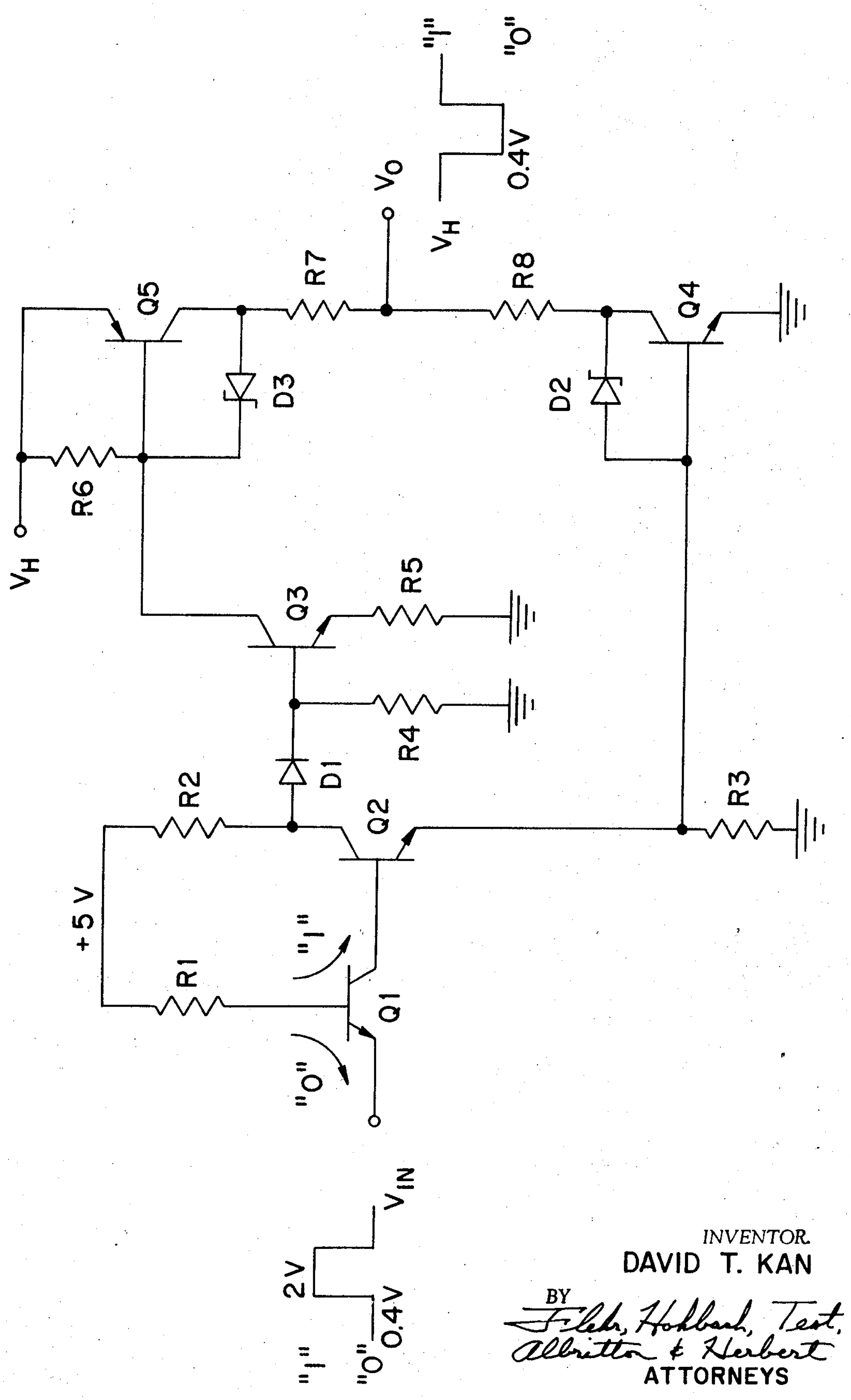
INVENTOR.
DAVID T. KAN
BY Flehr, Hohbach, Test, Albritton & Herbert
ATTORNEYS

GATE CIRCUIT WITH TTL INPUT AND COMPLIMENTARY OUTPUTS

BACKGROUND OF THE INVENTION

The present invention is directed to a gate circuit and more particularly to a circuit having a transistor-transistor-logic (TTL) input characteristic and a high voltage output.

A TTL input characteristic is desirable for many gate circuits since this type of logic is used as a standard building block. However, where a high voltage is required, either a large amount of power must be dissipated or alternatively the high frequency response of the TTL circuit reduced. The basic reason for the foregoing is the use of a load resistor in the TTL output circuit across which the output voltage swing must be developed. Thus, as load current is increased due to an increase in output voltage, the load resistor increases power dissipation in proportion to the square of the current.

From a switching speed standpoint in a TTL circuit small rise and fall times can be achieved when capacitive load is present only at the expense of high standby power dissipation.

While complementary output transistors do not require a load resistor, they are normally driven at two different dc drive levels. This is, of course, incompatible with the normal TTL input which is single ended.

OBJECTS AND SUMMARY OF THE INVENTION

It is, therefore, an object of the present invention to provide a gate circuit having a TTL input characteristic with a high voltage output but with low power dissipation.

It is another object of the invention to provide a gate circuit as above which has a high switching speed even with capacitive loads.

In accordance with the above objects there is provided a gate circuit having an output terminal switchable between two levels in response to a bi-level input signal on an input terminal. A pair of complementary output transistor are provided with two terminals of the same type coupled together and to the output terminal. Each of the transistors also includes input control terminals and second output terminals of the same type. In-phase control signals to the input control terminals drive the two output transistors into simultaneous conductive and non-conductive states respectively. Phase splitting means have two output terminals of opposite phase each of the terminals. Inverting current source means are series coupled between one of the input control terminals and a corresponding output terminal of the phase splitting means to provide in phase signals at the input control terminals. Means are provided for coupling said phase splitting means into an opposite phase condition in response to a level change in the input signal, whereby the states of the output transistors are reversed.

BRIEF DESCRIPTION OF THE DRAWING

The single FIGURE is a circuit schematic embodying the present invention.

DETAILED DESCRIPTION OF THE PREFERRED EMBODIMENT

The gate circuit of the present invention as illustrated in the single figure has an output terminal, $V_0$, switchable between two levels "1" and "0" in response to a bi-level input signal at the input terminal, $V_{in}$. The actual voltage level on the output signal is varied between $V_H$ or "1" a relatively high voltage level which, for example, may be from 25 to 100 volts, and 0.4 volts or "0" which is merely the saturation voltage drop of a transistor. Similarly, the input voltage level normally varies may range from ground to 5 volts. This is the normal input voltage range for a TTL type circuit. The "1" input level may vary between 2 to 5 volts.

Input terminal $V_{in}$ is coupled to a current steering transistor Q1 which has its collector coupled to the base input of a phase splitting transistor Q2. The base of Q1 is biased by a resistor R1 coupled to a positive 5 volt source; similarly the collector of Q2 if coupled to the 5 volt source through a resistor R2. The effective base-emitter diode and the base-collector diode of Q1 respectively steer current away from Q2 as indicated by the arrow designated "0" and toward Q2 as indicated by the arrow designated "1". This steering places Q2 in a non-conductive state at the "0" input level and in a conductive state at the "1" input level.

The emitter terminal of Q2 is grounded through a resistor R3 and also coupled to the base input of an NPN output transistor Q4. The other output terminal of Q2, the collector terminal, is coupled to the base input terminal of a PNP output transistor Q5. However, this coupling is accomplished through an inverting current source which is series coupled and which includes the transistor Q3 which has its base input coupled to the collector of Q2 through a diode D1, its collector output terminal coupled to the base input control terminal of transistor Q5 and its emitter terminal coupled to ground through a resistor R5. Biasing is provided to Q3 by a resistor R4 coupled between the base input and ground.

Output transistors Q4 and Q5 are complementary being NPN and PNP types respectively and have their collector terminals coupled together and to the output terminal $V_0$. In addition, in the collector circuit are resistors R7 and R8 which are of relatively low resistance to limit current. The emitter of Q4 is coupled to ground and the emitter of Q5 is coupled to high voltage source, $V_H$. Biasing resistor R6 is coupled between the base of Q5 and $V_H$.

Diode D1 is a biasing diode which prevents Q3 from going into its conductive state when Q2 is on or conductive.

Diodes D2 and D3 are respectively coupled between the base collector terminals of transistors Q4 and Q5 and are Schottky type diodes which clamp the transistors thereby increasing the switching speed of the circuit. Specifically, the Schottky diodes prevent the saturation of the output transistors since they are in parallel with the base collector diodes and the 0.3 volt turn on voltage of the diodes is substantially lower than the 0.7 volt of a normal diode. In addition, the Schottky diodes function in their majority carrier mode whereas a normal diode functions in a minority carrier mode.

OPERATION

When the input voltage at $V_{in}$ is low or at a "0" level the steering transistor Q1 draws current away from the base of Q2 thereby making it non-conductive Thus, the collector of Q2 is high being close to the 5 volt supply level while the emitter of Q2 is in an opposite phase or low. Q4 is therefore nonconductive and Q3 is rendered conductive. Resistor R2, diode D1 and resistor R4 determine the voltage at the base of Q3. The collector current of Q3 is determined essentially by resistor R5 and the base voltage of Q3. Q3 acts as a type of buffer to allow in effect separation of the input signal between the two output transistors Q4 and Q5. It is also apparent that any increase in load current through Q5 does not affect the constant current through Q3 since the emitter current of Q3 fixes the collector current. Thus, an increase in $V_H$ merely causes a linear increase in stand by power consumption, i.e., $V_H \times i_{Q3}$. With Q3 conductive, Q5 is made conductive and the collector voltage of Q5 approaches $V_H$. This, therefore, is the "1" level at the output terminal $V_0$.

It is apparent that Q3 in addition to serving as a current source has inverted the condition of the collector of Q2 which is opposite in phase to the emitter of Q2 to provide in-phase signals to the base input terminals of Q5 and Q4 respectively. Since they are complementary type transistors this means that while Q5 is in the conductive state Q4 is non-conductive.

With Q2 off the base current supplied to Q4 is zero and, of course, Q4 is off. Thus, the standby current in Q4 is zero. The standby current in Q5 is equal the difference between the collector current of Q3 and the current through resistor R6. Since the collector emitter drop of Q5 is very small and the resistors R7 and R8 are in the range of 50 ohms the power dissipation in the output stage is very small. Thus, the main power dissipation is determined by resistor R5 which, of course, has a constant current.

When the input voltage at $V_{in}$ is high or at the "1" level, Q2 is placed in an on condition. The current through R2 flows into the base of Q4 placing it in a conductive condition. The base of Q3 meanwhile is approximately at $V_{sat} + V_{be}$. The diode drop across D1 sets the base voltage of Q3 to be approximately $V_{sat}$ and this turns off Q3. In this condition, the standby current in Q5 is zero since Q3 is off; and Q4 the standby current is equal to the difference between the emitter current of Q2 and the current through resistor R3. Since these currents are very small, there is very little power dissipation in this condition.

If the high voltage supply $V_H$ is increased, the corresponding increase in standby power dissipation of the circuit is merely a product of the constant collector current through Q3 and the increase in supply voltage. In comparison, in prior art circuits the maximum standby power dissipation in the low output level state, "0", is proportional to the square of the high voltage supply since an increase in $V_H$ would increase the current to the load resistor which is normally present.

In addition to reduction of standby power dissipation the present invention also has the ability to either supply current to the load or absorb current from it. For example, if a supply of load current is needed transistor Q5 when on is capable of delivering a large current limited only by $V_H$, R7 and the power dissipation allowed. If on the other hand a load current is needed to be absorbed, the transistor Q4 will take over being placed in its conductive condition to again absorb a large amount of current without undue power dissipation. This power dissipation would, of course, only be absorbed by the base emitter drop in Q4 and the relatively small resistance of R8. Thus, in either the high or low state the output impedance of the gate is substantially equal to R7 or R8 neglecting the saturation resistance of the transistors. In the above manner the circuit can charge and then discharge a capacitive load very quickly without requiring substantial amounts of standby power.

The circuit of the present invention was operated and with $V_H$ equal to 15 volts the rise and fall time with a load capacitance of 15pF was found to be 15ns with the standby power dissipation at 65mW. The circuit values in ohms were as follows: R1 = 4K; R2, R3 = 1.2K; R4 = 2.2K; R5 = 560Ω; R6 = 750Ω; R7, R8 = 50Ω.

A conventional TTL gate which achieves the same rise and fall time would require approximately 220mW of standby power.

Thus, the present invention provides a high voltage, high speed, low power gate circuit which is ideal for driving metal oxide semiconductor circuits and capacitive loads. Low power dissipation of the circuit makes it practical to integrate the entire circuit on a small chip.

I claim:

1. A gate circuit having an output terminal switchable between two levels in response to a bi-level input signal on an input terminal said circuit comprising: a pair of complementary output transistors with two terminals of the same type coupled together and to said output terminal, each of said transistors also including input control terminals and second output terminals of the same type, in-phase control signals to said input control terminals driving said two output transistors into simultaneous conductive and non-conductive states respectively; phase splitting means having two output terminals of opposite phase each of such terminals being respectively coupled to one of said input control terminals; inverting current source means series coupled between one of said input control terminals and a corresponding output terminal of said phase splitting means to provide in phase signals at said output control terminals said inverting current source means including a transistor with a resistor connected to an output terminal thereof; and means coupling said phase splitting means to said input terminal for driving said phase splitting means into an opposite phase condition in response to a level change in said input signal, whereby said states of said output transistors are reversed.

2. A gate circuit as in claim 1 where said driving means includes a transistor with emitter and collector terminals, said emitter terminal being coupled to said input terminal of said circuit, said collector terminal being coupled to said phase splitting means, and the effective base-emitter diode and base-collector diode of said transistor acting as current steering diodes for reversing the phase condition on said output terminals of said phase-splitting means.

3. A gate circuit as in claim 1 where said transistor of said inverting current source has its base terminal coupled to said phase-splitting means, one output terminal coupled to the control input of said output transistor and to a high voltage supply and the other output terminal coupled to common through said resistor, said resistor essentially determining the constant current produced by said current source, such constant current and said high voltage substantially determining the standby power dissipation of said circuit.

4. A gate circuit as in claim 1 where one of said output transistors has its second output terminal coupled to a high voltage supply and the other output transistor has its second output terminal coupled to common.

5. A gate circuit having an output terminal switchable between two levels in response to a bi-level input signal on the input terminal said circuit comprising: a pair of complementary output transistors with their collectors coupled together and to said output terminal and having base input control terminals and emitter terminals the emitter terminal of one transistor being coupled to common and the emitter terminal of one transistor being coupled to common and the emitter terminal of the other to a relatively high voltage supply; phase splitting means including a transistor where the emitter of the transistor is coupled to the base input of said output transistor which has its emitter coupled to common and the collector terminal of said phase splitting transistor is coupled to the base input terminal of the other output transistor through an inverting current source which is series coupled; said inverting current source including a transistor having a collector terminal coupled to the base input of said output transistor, an emitter terminal coupled to ground through a resistor and a base terminal coupled to the collector of the phase splitting transistor; and diode steering means for driving said phase splitting transistor including a transistor having an emitter terminal coupled to the input terminal and a collector terminal coupled to the base input of the phase splitting transistor said driving transistor providing in effect effective diodes between its base-emitter and base-collector terminals to steer current toward and away from the base input of said phase splitting transistor.

* * * * *